US012595169B2

(12) United States Patent　　　　　　(10) Patent No.: US 12,595,169 B2
Hettler et al.　　　　　　　　　　　　(45) Date of Patent:　Apr. 7, 2026

(54) HERMETICALLY SEALED GLASS PACKAGE

(71) Applicant: Schott AG, Mainz (DE)

(72) Inventors: Robert Hettler, Kumhausen (DE); Jens Ulrich Thomas, Mainz (DE); Antti Määttänen, Tampere (SE); Jochen Herzberg, Allhaming (AT); Yutaka Onezawa, Otsu (JP); Thomas Zetterer, Landshut (DE)

(73) Assignee: Schott AG, Mainz (DE)

( * ) Notice: Subject to any disclaimer, the term of this patent is extended or adjusted under 35 U.S.C. 154(b) by 610 days.

(21) Appl. No.: 17/705,714

(22) Filed: Mar. 28, 2022

(65) Prior Publication Data

US 2022/0219972 A1　　Jul. 14, 2022

Related U.S. Application Data

(63) Continuation of application No. PCT/EP2020/076953, filed on Sep. 25, 2020.

(30) Foreign Application Priority Data

Sep. 26, 2019　(DE) ..................... 10 2019 125 963.0

(51) Int. Cl.
　B81B 3/00　　　(2006.01)
　B23K 26/20　　(2014.01)
　　　　(Continued)

(52) U.S. Cl.
　CPC ........ B81C 1/00317 (2013.01); B23K 26/206 (2013.01); B23K 26/324 (2013.01);
　　　　(Continued)

(58) Field of Classification Search
　None
　See application file for complete search history.

(56) References Cited

U.S. PATENT DOCUMENTS 5,489,321 A *　2/1996　Tracy ..................... C03C 27/06
　　　　　　　　　　　　　　　　　　　　156/99
9,607,913 B1 *　3/2017　Britz ..................... H01L 23/345
　　　　　　　　(Continued)

FOREIGN PATENT DOCUMENTS

DE　　　　146 389　　　　2/1981
DE　　39 15 920 A1　　11/1990
　　　　　(Continued)

OTHER PUBLICATIONS

Notification of the Transmission of the International Search Report and Written Opinion of the International Search Authority or Declaration dated Dec. 23, 2020 for International Application No. PCT/EP2020/076953 (14 pages).

(Continued)

*Primary Examiner* — Benjamin P Sandvik
(74) *Attorney, Agent, or Firm* — TAYLOR & EDELSTEIN, PC

(57)　　　　　ABSTRACT

A hermetically sealed package for thermal encapsulation of a functional area includes: a base substrate; a cover substrate, the base substrate together with the cover substrate forming at least part of the package or forming the package, at least one of the base substrate or the cover substrate being in the form of a thermal insulator; at least one functional area hermetically sealed by the package, heat can be generated inside the at least one functional area of the package; and at least one laser bonding line hermetically joining the base substrate and the cover substrate to one another. The at least one laser bonding line has a height perpendicular to its bonding plane.

15 Claims, 5 Drawing Sheets

(51) Int. Cl.
  B23K 26/324 (2014.01)
  B81C 1/00 (2006.01)

(52) U.S. Cl.
  CPC .... B81B 3/0081 (2013.01); *B81C 2203/0109*
    (2013.01); *B81C 2203/0118* (2013.01); *B81C*
    *2203/037* (2013.01)

(56) References Cited

U.S. PATENT DOCUMENTS

| | | | |
|---|---|---|---|
| 10,788,370 | B2 | 9/2020 | Herrmann et al. |
| 2005/0051884 | A1* | 3/2005 | Stevens .................. H01L 23/10 |
| | | | 257/E25.031 |
| 2007/0107524 | A1* | 5/2007 | O'Brien ................ G01L 9/0073 |
| | | | 73/754 |
| 2012/0161305 | A1 | 6/2012 | Ruben et al. |
| 2013/0126938 | A1 | 5/2013 | Eberhardt et al. |

| | | | |
|---|---|---|---|
| 2016/0192524 | A1* | 6/2016 | Ruben .................... H05K 5/066 |
| | | | 361/728 |
| 2018/0375076 | A1 | 12/2018 | Lampe-Onnerud et al. |
| 2021/0078104 | A1* | 3/2021 | Määttänen ......... B23K 26/1224 |

FOREIGN PATENT DOCUMENTS

| | | |
|---|---|---|
| DE | 102 35 372 A1 | 2/2004 |
| DE | 10 2007 038 943 A1 | 2/2009 |
| EP | 3 012 059 A2 | 4/2016 |
| JP | 2007-171152 A | 7/2007 |
| WO | 2016/078806 A1 | 5/2016 |
| WO | 2018/211176 A1 | 11/2018 |

OTHER PUBLICATIONS

"Thresholds for thermal damage to normal tissues: an update", by P. Yarmolenko et al., Int. J. Hyperthermia 2011, pp. 320-343 (25 pages).

* cited by examiner welding line functional area glass cover
(on substrate)

functional area
cover substrate (e.g. cavity)

functional area
base substrate
(e.g. conductive layer 34)

Re-Distribution Layer

Glass Carrier with
Through Glass Vias

Electronic Components

Glass Cover

Glass Spacer Layer

Start with TGV Wafer

Add Re-Distribuiton Layer

Mount Components (i.e. soldering, Conductive Epoxy, Wire Bond)

Add Spacer Wafer (Frame Opering, laser welded)

Add Cover Substrate    (Laser Weld)

| A | Providing the component carrying substrate with recesses for the components to be accommodated |
| B | Applying the cover substrate and sealing the cavities |
| C | Laser welding the accommodation cavities |
| D | Separating the wafer / dicing the encapsulations |

HERMETICALLY SEALED GLASS PACKAGE

CROSS REFERENCE TO RELATED APPLICATIONS

This is a continuation of International Patent Application No. PCT/EP2020/076953 entitled "HERMETICALLY SEALED GLASS ENCLOSURE", filed on Sep. 25, 2020, which is incorporated in its entirety herein by reference. International Patent Application No. PCT/EP2020/076953 claims priority to German Patent Application No. DE 10 2019 125 963.0 filed on Sep. 26, 2019, which is incorporated in its entirety herein by reference.

BACKGROUND OF THE INVENTION

1. Field of the Invention

The invention relates to a hermetically sealed, in particular multi-sealed glass package, and to a method for providing a hermetically sealed glass package.

2. Description of the Related Art

Hermetically sealed packages, which may also be referred to as enclosures, encapsulations, or housings, can for instance be used to protect sensitive electronics, circuits, or sensors, for example. They allow applying medical implants, for example in the area of the heart, in the retina, or for bio-processors. Bio-processors made from titanium have been known and are being employed.

Sensors can be protected against particularly adverse environmental conditions by a package. This field also includes MEMSs (micro-electromechanical systems), barometers, blood gas sensors, glucose sensors, etc.

Another field of application for a package can be found in a case for a smartphone, in the field of virtual reality glasses and similar devices. A package may also be used for the production of flow batteries, for example in the context of electro-mobility. However, packages can also find application in the aerospace industry, in high-temperature applications, and in the field of micro-optics.

The aforementioned intended purposes have in common that the electronics are subject to high requirements with regard to their robustness. In order to enable the use of electronics that is not expected to withstand such external impacts, the package must be protected from such adverse environmental influences. Furthermore, there may be the requirement of ensuring an exchange with the interior of the package, i.e. with the cavity defined by the package, for example including electromagnetic radiation, for example in the visible range and/or in the range of microwave radiation, that means that the package should be transparent at least partially, i.e. at least in sections thereof and/or at least for some range of wavelengths. This transparency allows for communication processes, data or power transfer, measurements of and with the electronics or the sensor disposed in the cavity. In particular optical communication techniques or optical data and power transfer can be made possible.

In principle, it has been known to join a plurality of parts and to arrange these parts such that an accommodation area is created in an intermediate space, which can accommodate components. For example, European patent EP 3 012 059 B1, which is hereby incorporated by reference, discloses a method for producing a transparent piece for protecting an optical component. A novel laser process is used for this purpose.

It can be problematic if a large amount of thermal energy is released from inside the package, be it over a short period of time or over a longer period of time, for example in the case of use as a bio-implant, namely if the heat escaping from the package might cause damage in the vicinity thereof. Studies are known, which already address the impact of heat on various types of tissue, and typically it is assumed that local damage already occurs when a local temperature of 43 degrees Celsius is exceeded, which can already lead to cell death, depending on the location of the damage. In the event of a malfunction, such as a short circuit in a semiconductor component or a battery, for example, temperatures of over 100 degrees Celsius can be reached in a short time.

What is needed in the art is a way to provide packages and in particular to make them more robust. In other words, what is needed is a way to provide an improved package that reduces temperature loads on the vicinity, for example, to prevent cell damage.

SUMMARY OF THE INVENTION

In some exemplary embodiments provided according to the present invention, a hermetically sealed package for thermal encapsulation of a functional area includes: a base substrate; a cover substrate, the base substrate together with the cover substrate forming at least part of the package or forming the package, at least one of the base substrate or the cover substrate being in the form of a thermal insulator; at least one functional area hermetically sealed by the package, heat can be generated inside the at least one functional area of the package; and at least one laser bonding line hermetically joining the base substrate and the cover substrate to one another. The at least one laser bonding line has a height perpendicular to its bonding plane.

In some exemplary embodiments provided according to the present invention, a method for providing a hermetically sealed package is provided. The package encloses a functional area. The method includes: providing a base substrate, at least one intermediate substrate, and a cover substrate, the cover substrate being transparent for at least one range of wavelengths at least partially or in sections thereof and therefore being a transparent cover substrate; arranging at least one accommodation item inside the functional area; arranging the cover substrate on the base substrate above the at least one accommodation item thereby creating at least one contact area between the base substrate and the cover substrate, so that each package has at least one contact area; and hermetically sealing the functional area by forming at least one laser bonding line along the at least one contact area of each package. At least one of the base substrate or the cover substrate is designed to be thermally insulating.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
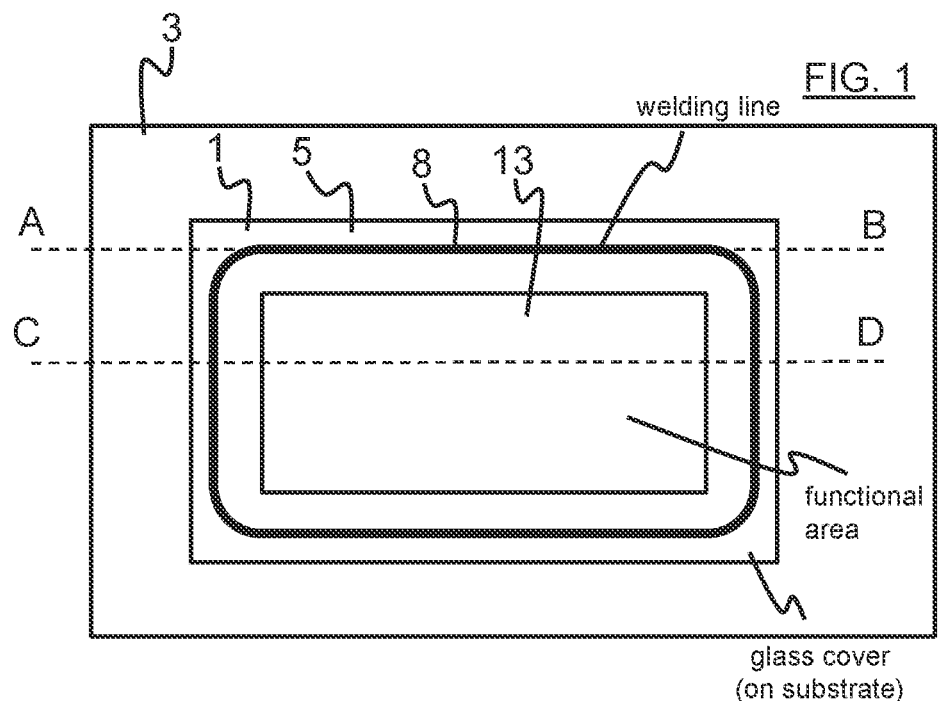
FIG. 1 illustrates a plan view of a package.

Exemplary embodiments provided according to the invention provide packages that can reduce, delay, or control the heat dissipation from the package into the environment. Optionally, the package provided according to the invention allows use of cheaper components, due to the protective effect it provides. In particular, it becomes possible to use components with a greater error tolerance, which are cheaper to manufacture, since embodiments provided according to the invention make it possible to tolerate a component failure if it does not entail a temperature peak any more, for example, in the tissue.

Yet another aspect of the present invention is based on the finding that in the case of a hermetically sealed package solution, special provisions might have to be made in order to dissipate any heat that might be generated in the package, for example from power semiconductors, over an extended period of time.

A package provided according to the invention is therefore designed for thermal encapsulation of a functional area. In other words, the package is thermally insulating such that heat is prevented from escaping out of the package to the environment, especially heat spikes that might occur, for example in the event of a failure of an electronic component in the package. For this purpose, the package comprises at least one base substrate and one cover substrate, the base substrate together with the cover substrate forming at least part of the package or forming the package. Furthermore, the package includes at least one functional area that is hermetically sealed by the package, for example a cavity.

The package includes at least one laser bonding line, so that the substrates of the package are joined to one another in a hermetically sealed manner by the at least one laser bonding line. Each laser bonding line has a height HL perpendicular to its bonding plane. In some embodiments, the height HL of the laser bonding line extends into the material of the substrate arranged above the laser bonding line. On the opposite side, the laser bonding line extends into the material of the substrate arranged below the laser bonding line. For example, the cover substrate is fused to the base substrate. In other words, material of one substrate melts and mixes with material of the other substrate during the bonding step or in the laser bonding line to produce the firm and non-releasable hermetic bond between the one substrate and the other substrate.

In some embodiments, at least one intermediate substrate is disposed between the base substrate and the cover substrate, and in this case the base substrate is joined to the intermediate substrate in a first bonding plane by at least one first laser bonding line, and the cover substrate is joined to the intermediate substrate in a second bonding plane by at least one second laser bonding line.

Possibly, heat is generated inside the functional area of the package, for example by a power electronic component disposed therein, which produces heat during operation, or if component failure of an electronic component occurs inside the package, which is accompanied by a thermal spike.

Such a thermal peak load, i.e. high thermal energy in a short time, might lead to an increased temperature at certain points or in certain areas in the vicinity surrounding the package, if the package gives off the heat to the outside in an unhindered manner. For example, if the package is located in a body, i.e. for example in tissue, such increased temperature can possibly lead to cell damage and even cell death. It is generally accepted that in the case of human tissue, for example, cell damage and cell death can occur above a threshold temperature of 43 degrees Celsius, see, e.g. "Thresholds for thermal damage to normal tissues: an update", by P. Yarmolenko et al., Int. J. Hyperthermia 2011, pp. 320-343.

On the other hand, if a power semiconductor fails, it is possible that a local temperature is reached in the semiconductor component, which by far exceeds 100 degrees Celsius and might also exceed the melting temperature of the semiconductor component. In order to protect the human tissue from cell damage in this example of a defect in a semiconductor component which is intended to be used as a bio-implant in human tissue, for example, the package can be implemented such that the generated heat is dissipated to the surrounding tissue over an extended period of time so that the peak temperature is reduced far enough to not exceed the critical temperature of 43 degrees Celsius.

In the most general case, this can be achieved by providing at least the base substrate and/or the cover substrate in the form of a thermal insulator, so that the heat arising inside the package is not, or considerably more slowly, released to the environment.

The package can include at least one intermediate substrate. In this case, the one or more functional areas may be arranged on the intermediate substrate.

The base substrate, the one or more intermediate substrates, and the cover substrate may all be in the form of a thermal insulator, so that the entire outer shell of the package acts as a thermal insulator.

The base substrate may be made of a material of low thermal conductivity. The base substrate, the one or more intermediate substrates, and/or the cover substrate may comprise a vitreous material, for example glass, glass ceramics, silicon, sapphire, or a combination of the aforementioned materials. For example, glass or vitreous materials have proven to be particularly advantageous because they are very well biocompatible, chemically compatible with the human body, no interactions are known with the human organism, and at the same time glass provides excellent insulating properties. Furthermore, glass can be made so as to be transparent to radiation so that, for example, wireless data exchange can be ensured through radiation or wave information, or contactless charging of electronics or batteries that are optionally disposed inside the package. If a substrate 13 for example the cover substrate—is a substrate that is transparent in the optical wavelength range, for example an optically transparent substrate, power supply to the package can be implemented optically, for example using a photovoltaic cell or a different type of optical receiver disposed inside the package for providing electrical power. The package can then be described as a self-sufficient package.

To produce the hermetic seal, for example around the functional area, one of the laser bonding lines can surround the functional area, for example circumferentially, at a distance DF therefrom. In some embodiments, the distance DF around the functional area is consistent, so that the laser bonding line extends around the functional area at approximately the same distance therefrom on all sides. However, depending on the application case, the distance DF may also vary. This might be more favorable from a production technology point of view when a plurality of packages is joined at the same time in one and the same processing step and straight bonding lines or laser bonding lines are produced along the respective contact areas of the individual packages, for example. This may also be the case if the functional area or the package is round or has an arbitrary shape and the laser bonding line hermetically sealing the functional area is drawn in the form of straight lines, for example. In a particular example, the functional area may be in the form of a cavity, and the cavity may in turn have optical properties, for example it may have the shape of a lens, such as a collecting lens, and the laser bonding line may be drawn around the cavity in a pattern differing therefrom.

The functional area of the package is, for example, adapted to accommodate at least one accommodation item such as an electronic circuit, a sensor, or MEMS, so that at least one accommodation item is disposed inside the package. The at least one accommodation item may comprise a power semiconductor chip, for example a GaN LED, a SiC power transistor, a GaAs power transistor, or a GaN power transistor.

The accommodation item may be disposed in a cavity which is surrounded by the package on all sides thereof, i.e. completely. The functional area or the cavity may be introduced into the base substrate, for example by producing a recess in the base substrate, for example in an abrasive manner, so that the functional area and/or the at least one accommodation item is surrounded by the material of the base substrate at the bottom and on the lateral side. The functional area or the cavity may also be provided above the base substrate. The cavity has a bottom, a laterally surrounding edge, and an upper side. Alternatively, the upper side may be described as a first side, the bottom side as a second side opposite the first side, and the edge as the intermediate area between the first and second sides, with the edge typically extending substantially perpendicular to the first and/or second sides. Also, the edge may have a height of 0, so that in this case the upper side will directly bear on the lower or bottom side, for example in the case where the functional area merely comprises a thin functional layer.

The package may also include a plurality of cavities, for example for accommodating at least one accommodation item in a respective cavity. In other words, the accommodation items in a package may be distributed over different cavities, resulting in a spatial separation of the components from one another in one and the same package. For example, it is possible in this way to accommodate a battery or storage cell that is optionally installed in the package, separately from other components. What can be avoided thereby is that, for example in the case where a component fails, further components are damaged or destroyed by the heat that occurs. For example, if a power transistor overheats, the battery or storage cell can be protected, so that the battery or storage cell will be prevented from overheating and releasing heat as well. Thus, overall, less heat will be accumulated or dissipated to the environment, and for example the overall temperature of the package will also remain lower as a result, so that in the case of a bio-implant, cell damage can be reduced or avoided.

The reduction in heat dissipation from the package into the environment can thus be improved by distributing components or accommodation items to different cavities in order to prevent "chain reactions" in which other components fail and release additional heat when a first component fails, for example. Another aspect is that by distributing the accommodation items over different cavities, the respective components will also be additionally protected. For example, a memory component may be arranged in its own cavity and, therefore, can possibly still be safely read out or disassembled even if a component in the package such as a power transistor or the like should fail.

Furthermore, alternatively or additionally, an insulating medium may be included in the one or more cavities in order to improve the insulation effect. In other words, the cavity is filled with an insulating medium different from the glass. The insulating medium is for example a fluid, for example a thermally insulating liquid or an insulating gas. Insulating medium also refers to an evacuated state of the one or more cavities, i.e. the one or more cavities are "filled with a vacuum", since a vacuum is well suited as an insulating medium as well. Due to the hermetic sealing of the one or more cavities, most advantageously by the laser welding process, it can be ensured that the filling of the one or more cavities with the insulating medium or with vacuum can be maintained over the long term.

In other words, in some embodiments, a plurality of accommodation items are disposed in the package, and the accommodation items are distributed to different cavities.

The hermetically sealed package may include through-glass passages, for example in an intermediate substrate which separates at least two cavities. The through-glass passages are provided for electrically connecting the accommodation items disposed in different cavities. The through-glass passages are, for example, in the form of through glass vias (TGV), and the vias are filled with electrically conductive material.

The package may include at least one electrical connection layer on at least one of the intermediate substrates. In this case it is particularly easy to arrange the components or accommodation items in the respective cavity and to connect them electrically. The electrical connection layer is disposed on the bottom of one or more or all of the cavities, for example, and establishes contact with the through glass via(s).

In fact, the package including a cavity in which for example one or more components can be arranged is an exemplary embodiment. However, the package provided according to the invention is not limited to the embodiment including a cavity, since a functional area may have or fulfil a function without need to include a cavity in the sense of a hollow space. One example of such a functional area is the application of an electrical connection layer on a substrate, which already defines a functional area without a cavity. Such an electrical connection layer may, for example, electrically connect two other functional areas, for example two cavities.

A substrate may also comprise a plurality of layers and may thus be a multi-layer laminate or composite. Such a multi-layer composite defining one of the layers of the package can then be bonded to the one or more further substrates by the laser welding process. This can therefore mean that the multi-layer composite is prepared in advance, for example by applying a coating onto a substrate and thus producing a two-layer composite, and this two-layer or multi-layer composite as a whole is bonded to the one or more layers in the manufacturing process of the package for making the package.

Employing a multi-layer composite in the package allows adding additional material properties to the package. For example, the multilayer composite may already have an internal stress or prestress or a direction of prestress, so that the amount of internal stress can be enhanced during the laser welding of the multilayer composite to the at least one further layer of the package. For example, if a preliminarily toughened multi-layer composite is used, this can improve the durability of the package. This may result in the package as a whole taking on the properties of a toughened package. In addition or as an alternative, the multi-layer composite may include one or more coating layers, for example a coating that might give rise to complications if this layer had to be bonded using the laser welding process. In other words, a substrate that is provided in the form of a multi-layer composite is provided as a "pack" or "stack" including layers that are already bonded together. It may include an optical coating.

A laser welding process is used to join the substrates to one another. The laser welding process can be controlled locally such that only a small or negligible amount of heat penetrates into the functional area or the one or more cavities as a result of the welding process. The laser welding process thus is executed virtually at room temperature, i.e. the package is virtually joined at room temperature.

The laser bonding line extends into the material of the substrate arranged above the laser bonding line, for example over a height HL. Within the laser bonding line, a local melting process occurs in the material so that, when the laser bonding line extends partly into a first substrate and partly into a second substrate, the two substrates are bonded to one another by being fused together. In other words, the base substrate, the intermediate substrate(s), and the cover substrate are joined together by being fused to one another by the laser bonding line(s).

In other words, the laser bonding line is provided or adapted so as to be capable of bridging gaps in the hermetic sealing of the package, for example by fusing two components to one another by the laser bonding line. In a case where the package only comprises a base substrate and a cover substrate for completely enclosing the functional area, the contact area between base substrate and cover substrate, i.e. the point or area or interface where the cover substrate and the base substrate adjoin each other, is bridged or bonded by the laser bonding line. As a result, the package is formed as an integral piece, with the interface between the components hermetically sealed by the laser bonding line.

In other words, for providing a package, a first (base substrate) and at least one second substrate (cover substrate) are provided in a first step, and the at least one second substrate (cover substrate) comprises transparent material, i.e. is transparent for at least one range of wavelengths at least partially or in sections thereof. The cover substrate may be placed directly on the base substrate, i.e. the cover substrate covers the cavity to be sealed, and the base substrate defines the respective bottom of the respective package. At least one contact area or interface is defined between the at least two substrates, so that each package has at least one contact area. The cavities are then hermetically sealed by bonding the at least two substrates along the contact area(s) of each package, for example in the contact area along a line at the edge of each package. In some embodiments, a plurality of packages can be produced jointly, for example from a shared starting substrate, for example in the form of wafers of a wafer stack, or only the base substrate can be provided in the form of a wafer. Subsequently, the method for producing a package may include the dicing of the respective package by a cutting or separation step.

In this case, the substrate layers or the base substrate and the cover substrate are stacked directly and in direct contact to each other, i.e. arranged so as to adjoin each other. Foreign materials are excluded as far as possible between the substrate layers, so that the most cohesive surface contact possible is created between one substrate layer and the adjoining substrate layer. In the case of two substrates, for example, the base substrate is arranged in direct contact to the cover substrate, for example without any other materials or any spacing between the base substrate and the cover substrate. In the example of more than two substrates, the base substrate is arranged directly adjoining the one or the first one of the intermediate substrate layer(s), the cover substrate in turn is arranged directly adjoining the one or the last one of the intermediate substrate layer(s).

Subsequently, the substrates are joined together using the novel laser welding process. In this case, a planar substrate layer is directly joined or bonded to the immediately adjoining planar substrate layer without providing or requiring any foreign material or non-planar material or intermediate layers for this purpose. That is, the substrates are bonded directly to one another. The laser bonding line introduced into the two-dimensional contact area between two substrate layers bonds the directly adjoining substrate layers to one another, i.e. directly adjacent to one another, in a non-releasable manner. The melting zone of the laser bonding line is therefore present in both substrates and seamlessly extends from the first substrate into the immediately adjoining second substrate, that is, for example, from the base substrate into the cover substrate. The novel laser welding technique is distinguished from previous techniques in which substrates are bonded to one another using a laser by the fact that the present method introduces significantly lower amounts of thermal energy into the substrate stack or the package, so that only little thermal energy dissipates into the rest of the package and parts or components disposed inside the functional area will be subjected to only a slight increase in temperature. This is even more important, since in the present case at least one of the substrates of the package has particularly good thermal insulation properties and, hence, the thermal energy that is applied to the package during the laser welding might prevail longer in the package before it is dissipated to the environment. The use of thermally insulating materials for a package in which parts/components are or can be arranged in the vicinity of a laser welding line therefore only becomes possible with the present novel laser welding technique in this combination.

Thus, a direct two-dimensional or even full-surface transition is formed from one substrate layer to the next substrate layer, i.e. a substrate-to-substrate transition or a glass-to-glass transition, for example. A locally limited volume in the form of a welding zone or laser bonding line is created, which includes material transferred or mixed between the adjoining substrate layers which, for example, have a sheet-like shape. In other words, material of the first substrate, for example the cover substrate, penetrates into the adjoining substrate, for example the intermediate substrate or the base substrate, and vice versa, i.e. material from the adjoining substrate penetrates into the first substrate, so that the welding zone includes a complete mixture of material from the adjoining substrates. The welding zone can therefore also be referred to as a convection zone.

The novel laser welding technique for producing the non-releasable glass-to-glass transition or substrate-to-substrate transition may be free of intermediate layers, glass frits, foils, or adhesives that had to be introduced between the substrates in earlier prior art processes. Rather, the non-releasable bond can be produced without such interfering intermediate layers or additional materials. This eliminates the use of additional materials, increases the achievable strength of the end product, and enables reliable hermetic sealing of the functional area or of the one or more cavities. The laser welding zone can be identified in the finished end product, for example by the specific local change in the refractive index of the materials in the small fusion area.

In some embodiments, a marker may be incorporated into at least one of the substrates.

The package may be transparent for some range of wavelengths at least partially and/or in sections thereof. In a simple example, the cover substrate of the package is optically transmissive, i.e. transparent in the visible wavelength range. However, transparency in the X-ray range, for example, may be advantageous as well. In other words, the cover substrate, for example, may comprise a vitreous material. Consequently, the cover substrate may be transparent or transmissive for at least one range of wavelengths, for example optically transparent. Depending on the application case, it may also be advantageous if the cover substrate is made to be opaque, i.e. optically non-transparent, like frosted glass. Reduced transparency or partial transmittance may also be sufficient for the functionality. For example, the cover substrate may comprise glass, glass ceramics, silicon, sapphire, or a combination of the aforementioned materials. In some embodiments, the cover substrate is a glass sheet, for example made of toughened glass, special glass, or high temperature resistant glass from, for example, the product portfolio provided by SCHOTT AG® of Mainz, Germany.

The package can be designed so that the at least one functional area of the package is adapted to accommodate at least one accommodation item with a size of 10 mm×10 mm or less, for example a size of 5 mm×5 mm or less, 2 mm×2 mm or less, or even 1 mm×1 mm or less. The size of the package will then depend on the size and number of accommodation items inside the functional areas or cavities of the package. For example, if a single accommodation item with a size of about 5 mm×5 mm is disposed in each of four cavities of the package which includes two cavities arranged next to each other and two cavities on top of each other, the package will typically have a size of 13 mm×13 mm or more, so as to ensure accommodation of the items inside the cavities.

A size specification based on practical considerations and determined by the fabrication method, which should however not be understood as a size limitation per se, is given by the size of the wafers to be cut. However, the use of wafers for the fabrication is considered to be only one example. For example, it is entirely possible to use glass sheets which can also have larger dimensions than typical wafer dimensions for producing the transparent package.

The invention furthermore provides a method for providing a hermetically sealed package including a functional area, for example a cavity, enclosed by the package. The method comprises the steps of providing at least a base substrate and a cover substrate, with the cover substrate being transparent for at least one range of wavelengths at least partially or in sections thereof and therefore being a transparent cover substrate; arranging at least one accommodation item inside the functional area, i.e. for example inside a cavity; arranging the cover substrate on the base substrate above the at least one accommodation item, thereby creating at least one contact area between the base substrate and the cover substrate, so that each package has at least one contact area; hermetically sealing the cavities by forming at least one laser bonding line along the at least one contact area of each package, wherein at least one of the base substrate and the cover substrate is designed to be thermally insulating.

In some embodiments, the cover substrate is joined to the base substrate by the laser bonding line. In other words, the cover substrate is placed on or in the base substrate without any intermediate layer and is joined to the base substrate immediately and directly by one or more shared laser bonding lines. In this case, the cover substrate together with the base substrate jointly form the complete package. In other words, no additional or further part is required to form or to seal the package, rather the base substrate, the at least one laser bonding line and the cover substrate jointly seal the functional area or the cavity completely and in a hermetically sealing manner. On the other hand, it may be advantageous to use one or more intermediate substrates, for example to separate a plurality of cavities from one another.

The at least two substrates or the base substrate and the cover substrate are arranged or attached to one another such that they come to lie flat against one another without any other sheets, layers, or inclusions present between the at least two substrates or between the base substrate, the cover substrate and optionally the intermediate substrate. For technical reasons, there might be unavoidable minor gas inclusions between the layers in the contact areas, which may be caused by some possible unevenness. The amount of gas trapped in the 2-dimensional contact area can be further reduced by increasing the pressure, for example, such as for example by pressing, or by a surface treatment of the substrate layers, for example of the contact surfaces, such as a grinding process. Prior evacuation is beneficial. Filling with a type of gas or else with a liquid may also be advantageous, depending on the process parameters and the materials to be employed.

In some embodiments, a gap that might arise between the substrates has a width of less than or equal to 5 μm, for example less than or equal to 1 μm. Such a gap arises, for example, due to tolerances in the substrate manufacturing, by thermal impacts or by inclusions of particles such as dust. Even with such a tolerable spacing which is still considered to be immediately adjoining in the context of the present invention, it is possible to laser weld in such a manner that the welding zone is between 10 and 50 μm in thickness so that a hermetic seal is ensured. Again, in this case, the welding zone extends from the first substrate into the second substrate adjoining the first substrate. Thus, the welding zone is introduced in the contact area between the first and second substrates and directly fuses the substrates to one another to form an inseparable bond. In other words, when the adjoining substrates are bonded in the welding zone, material of both substrates is directly melted in the welding zone, and the material of the first substrate mixes with the material of the second substrate to form an inseparable integral bond. The package produced in this way therefore comprises an integral, i.e. monolithic bond between the substrates in the welding zone.

A contact area does not need to be optically transparent. It may also be advantageous if the transparent substrate is opaque in the visible wavelength range. Only the substrate through which the laser passes to reach the contact area has at least one spectral "window" such that at least the wavelength of the employed laser can be transmitted through the substrate at least partially or at least in sections thereof. The contact area is adapted such that the laser is able to deposit energy there. For example, the surfaces of the two adjoining substrates may be joined by optical contact bonding and may furthermore exhibit a roughness in the nanometer range. The laser radiation will at least partially be absorbed at this interface, so that energy can be introduced there. In the sense of the present application, contact area is generally understood to mean an interface at which the incident laser beam can deposit energy so that a bonding process can be performed along the contact area.

Also within the scope of the invention is the package produced or formed by the aforementioned method.

In order to form the laser bonding line, a laser beam is directed, for example, around the functional area so that the functional area is hermetically sealed circumferentially along the at least one contact area. Optionally, the laser beam can be directed circumferentially around multiple times and/or optionally a plurality of laser bonding lines can be formed.

Furthermore provided according to the invention is the use of a package as produced according to the method described above, with a hermetically sealed functional area or cavity enclosed therein, as a medical implant or bio-implant, or as a sensor.

The invention will now be explained in more detail by way of exemplary embodiments and with reference to the figures in which identical and similar elements are partially denoted by the same reference numerals, while the features of the different exemplary embodiments can be combined with each other.

FIG. 1 shows a plan view of a package 1 provided according to the invention, with the circumferential laser welding zone 8 surrounding the functional area 13. Functional area 13 may be implemented in different ways. Examples of different configurations of the functional area 13 can also be found in the other FIGS. 3 through 8, which show sectional views and thus permit to illustrate the vertical structure of functional area 13. The various implementations of functional area 13 can all be schematically illustrated as in FIG. 1, as they will be represented similarly in a schematic plan view.

The functional area may fulfil various tasks, for example it may be implemented as an optical receiver or it may include a technical, electro-mechanical, and/or electronic component 2 which is disposed in the functional area 13. It is also possible to implement a plurality of such tasks in the functional area 13. On the upper side, the package 1 is covered by the upper substrate 5, for example a cap 5. The at least one laser welding zone 8 extends into this upper substrate 5.

Figure 2:
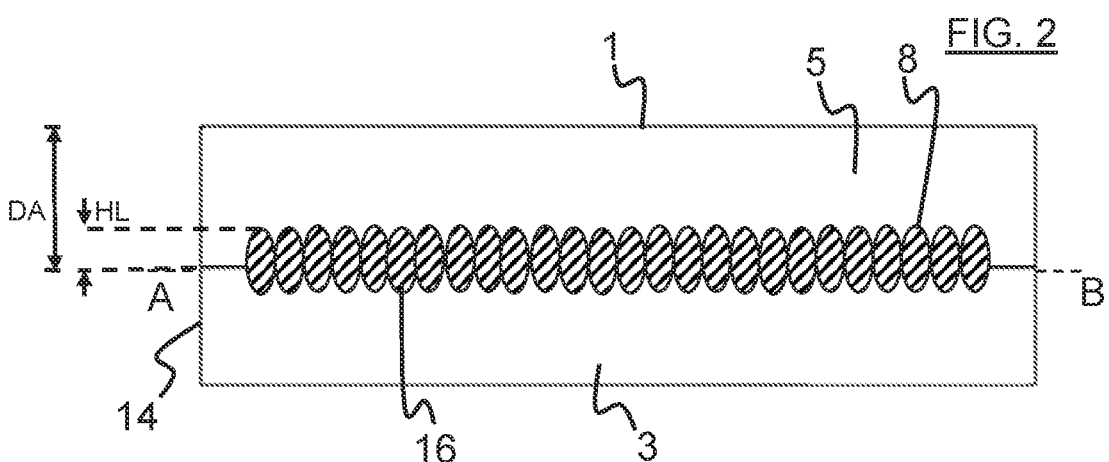
FIG. 2 illustrates a sectional side view of a package.

Referring to FIG. 2 which shows a first sectional view of an exemplary embodiment of a package 1, which comprises a base substrate 3 and a cover substrate 5. In other words, package 1 is made up or composed of two layers, namely base layer 3 and cover layer 5. FIG. 2 also shows the structure of laser welding line 8 in the form of a string of multiple laser pulse impact areas 16 which are placed so close to one another that the material of the base substrate 3 and of the cover substrate 5 seamlessly fuses to one another thereby hermetically sealing the functional area 13 or the cavity 12 (located behind the laser welding line 8 in this view).

Figure 3:
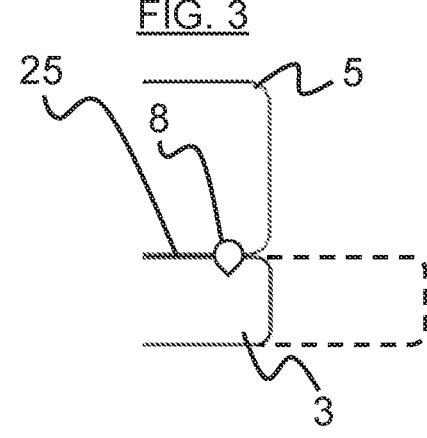
FIG. 3 is a detailed view of a bonding zone.

FIG. 3 shows a detail of the joining area, illustrating the interface zone, i.e. the contact area 25 and the laser welding zone 8. Laser welding zone 8 is provided in the contact area 25 to bond the two substrates 3, 5 to one another.

Figure 4:
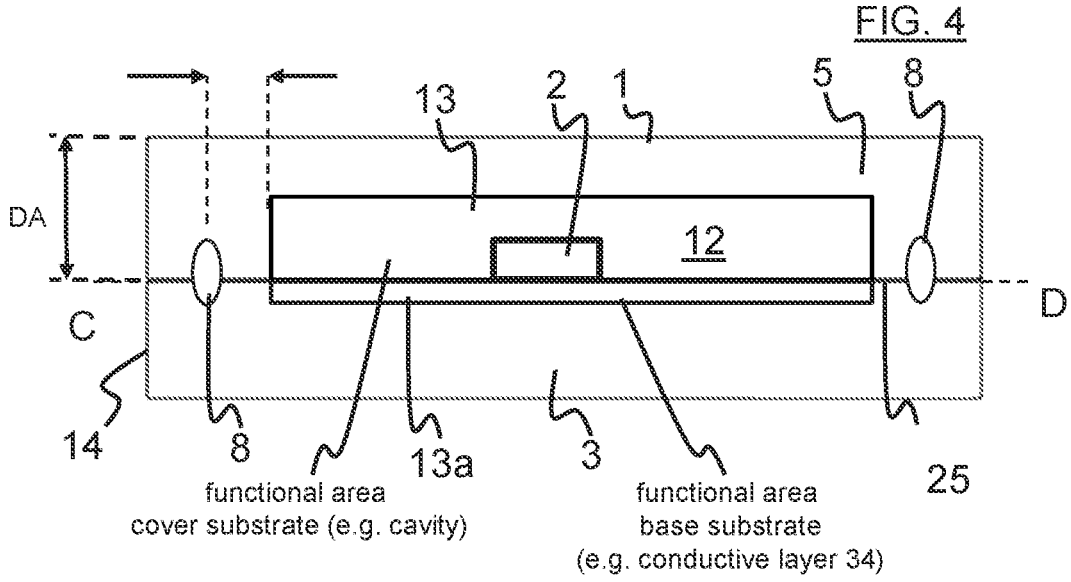
FIG. 4 is a sectional side view through the functional area of a package.

FIG. 4 shows a sectional view of an embodiment of a package 1 along line C-D as shown in FIG. 1. Thus, FIG. 4 shows a section through functional area 13, 13a which extends inside the package 1, for example in the form of a continuous hollow space or cavity. In other words, the cavity extends from base substrate 3 into the cover substrate 5 and, for example, is in the form of a recess made in the base substrate 3 and/or in the cover substrate 5. Here, functional area 13 is formed as a recess in cover substrate 5, functional area 13a is formed as a recess in base substrate 3, for example by an abrasive process such as a sandblasting process. In other words, the base substrate 3 has a recess 13a, and the cover substrate 5 has a recess 13 in which an accommodation item 2 is accommodated.

For example, the functional area 13a may also comprise an active layer, e.g. an electrically conductive layer 34. The active layer of functional area 13a may also comprise a photoreceiver, for example in the form of a photovoltaic cell, so as to be adapted to generate electrical power. In this case, the package 1 can be a self-sufficient package 1. The functional area 13 provided thereabove, within cover substrate 5, may comprise the cavity 12.

The laser welding zone 8 provided circumferentially around the functional area 13, 13a seals the functional area 13, 13a all around along the lateral sides thereof. It is conceivable to leave gaps in the laser welding zone 8 so that the functional area 13, 13a will not be sealed all around, for example in order to keep open a communication channel or space for an electrical connection, which may however also be used to establish fluid communication with the environment, for example. In other words, it might be contemplated to not seal predefined locations or points using the focused laser beam 9, but to rather achieve a hermetic seal by other ways there, such as by an adhesive. In some embodiments, the functional area 13, 13a is sealed along all of its sides and without any gaps, in order to ensure hermetic sealing of the functional area 13, 13a. An accommodation item 2 such as, e.g., an electronic component is arranged in the cavity 12 above functional area 13a, i.e., for example, on the conductive layer 34.

Figure 5:
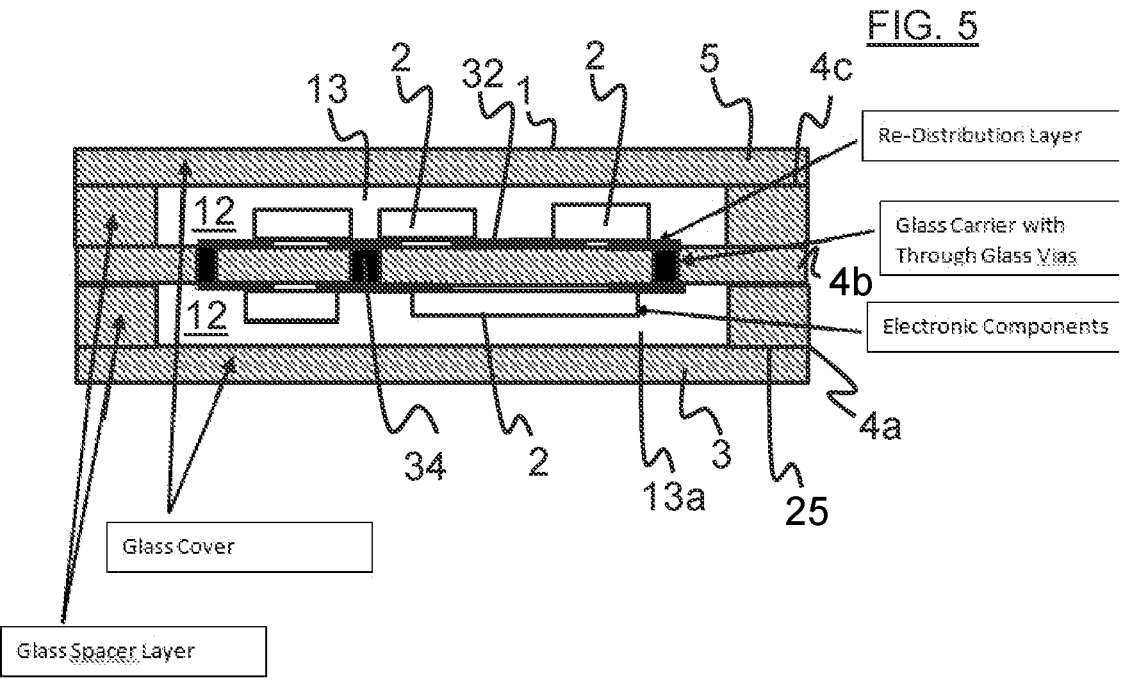
FIG. 5 is a sectional side view through the functional area of a package that has two cavities.

Referring to FIG. 5 which shows a further sectional view through a package 1 cutting through functional areas 13, 13a. The package 1 comprises five substrate layers, a base substrate 3, three intermediate substrates 4a, 4b, 4c, and a cover substrate 5. Intermediate substrates 4a and 4c each have a cavity 12 for accommodating components 2. Intermediate substrate 4b has electrical vias or through-glass passages 32, known as through glass vias (TGV), so that the components in functional area 13 can be electrically connected to those disposed in functional area 13a.

Functional area 13 is in the form of a cavity 12, with a plurality of components 2 arranged in the cavity. The components 2, in turn, are disposed on electrically conductive partial layers 34 which in turn are electrically connected to the through glass vias 32. Thus, the components 2 in functional area 13 are separated from the components 2 that are disposed in functional area 13a by intermediate layer 4b. Now, if a defect occurs in a component 2 which is arranged in functional area 13, or a liquid leaks out, or thermal overheating occurs, for example, then the components 2 disposed in functional area 13a will be separated therefrom. In this way it is possible to reduce or even prevent possible consequential defects of further components 2 as a result of a first component's failure. In order to further improve the insulating effect, an insulating medium is included in the two cavities 12.

Referring to FIGS. 6A through 6E which illustrate an example for producing a package 1 according to the invention. Starting with FIG. 6A, first the central intermediate substrate 4b is provided, which already has through glass vias 32 or into which the through glass vias 32 are introduced. In this example, for economic reasons, the fabrication process is performed in such a way that two packages 1 are built up using one wafer 4b. Later separation of the two packages 1 along separation line 10 may be achieved using a laser cutting process, for example. As an alternative, it is also conceivable to design a shared package which has cavities 12 arranged next to one another, i.e. corresponding to the example in FIG. 6E, without separating the two portions along separation line 10. In this case, horizontal through glass vias 32 (not shown) may be provided as well, for connecting the cavities 12 located next to one another, similar to the vertical through glass vias 32 as illustrated.

Figures 6A, 6B, 6C, 6D, 6E:
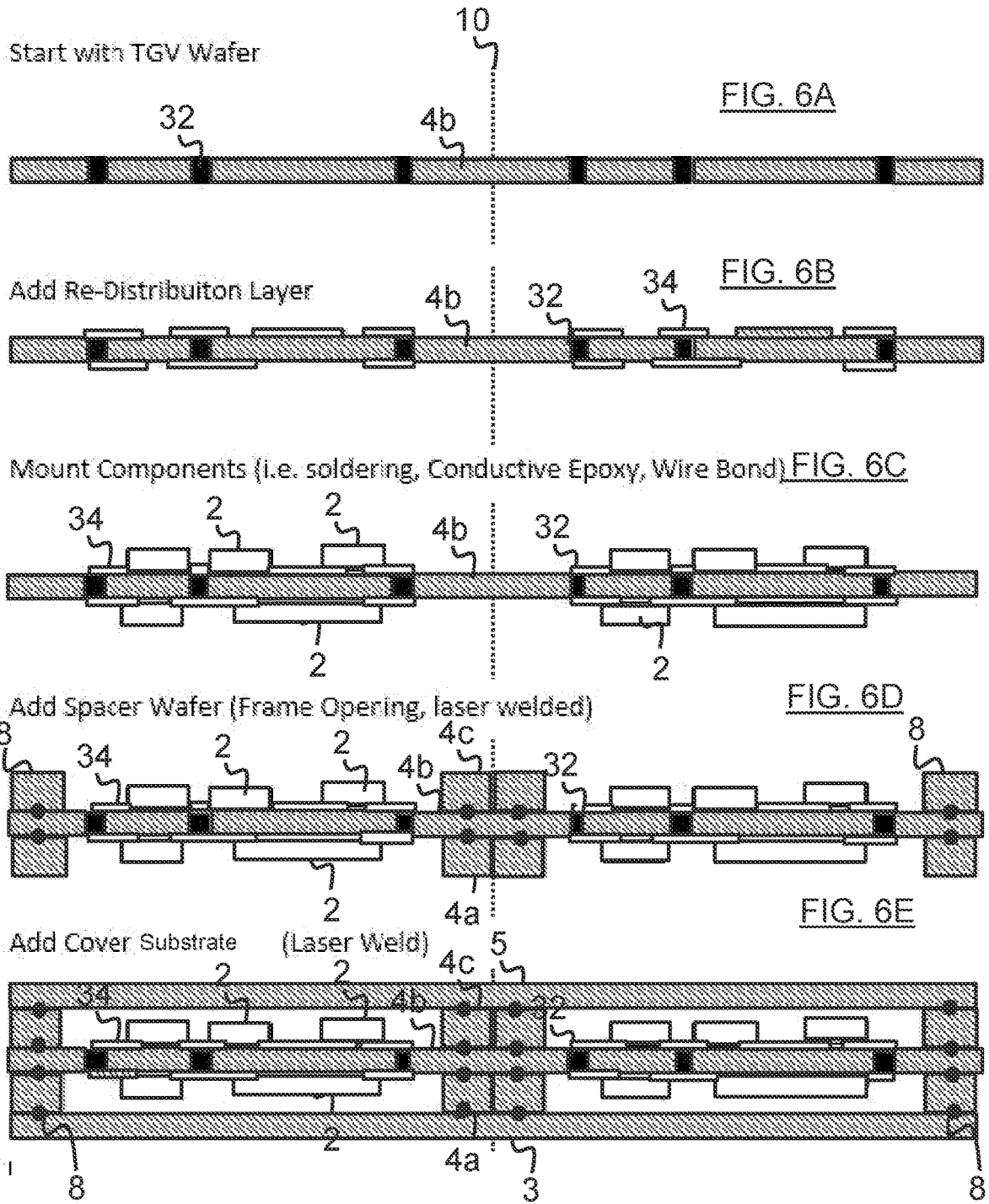
FIGS. 6A-6E show exemplary steps for producing a package.

FIG. 6B shows how an electrical contact layer 34 is applied in some areas of the central intermediate layer 4b on both sides thereof. The electrical contact layer 34 is partitioned into contact areas, and the contact areas can be electrically connected to one of the through glass vias 32, as illustrated. Some contact areas 34 may also be applied without being connected to through glass vias 32 if this is advantageous, for example in order to connect two components 2 inside one cavity to one another, rather than to components 2 disposed in another cavity 12 in the package 1.

FIG. 6C shows the mounting of accommodation items 2 in the areas corresponding to the later cavities 12, for example on contact areas 34. The components 2 can be electrically connected to other components 2 that are arranged in the same cavity 12 and/or to further components 2 which are arranged in another cavity 12, for example using the through glass vias 32. The components 2 can be electrically connected by soldering, welding, by epoxy conductive paste, or by wires, for example.

FIG. 6D illustrates the adding of spacer wafers 4a and 4c, one above and one below the intermediate layer 4b. Spacer wafers 4a and 4c are laser-welded to the intermediate layer 4b, i.e. a laser bonding line 8 is introduced in each case. Finally, FIG. 6E illustrates the adding of the base substrate 3 to the lower side of the package 1 and of the cover substrate 5 to the upper side of the package 1, and once again the substrates are joined by laser bonding lines 8.

Thus, the laser welding zone 8 is created along contact areas 25 by the laser pulse impacts 16, where the cover substrate 5 is welded or bonded to the base substrate 3.

Figure 7:
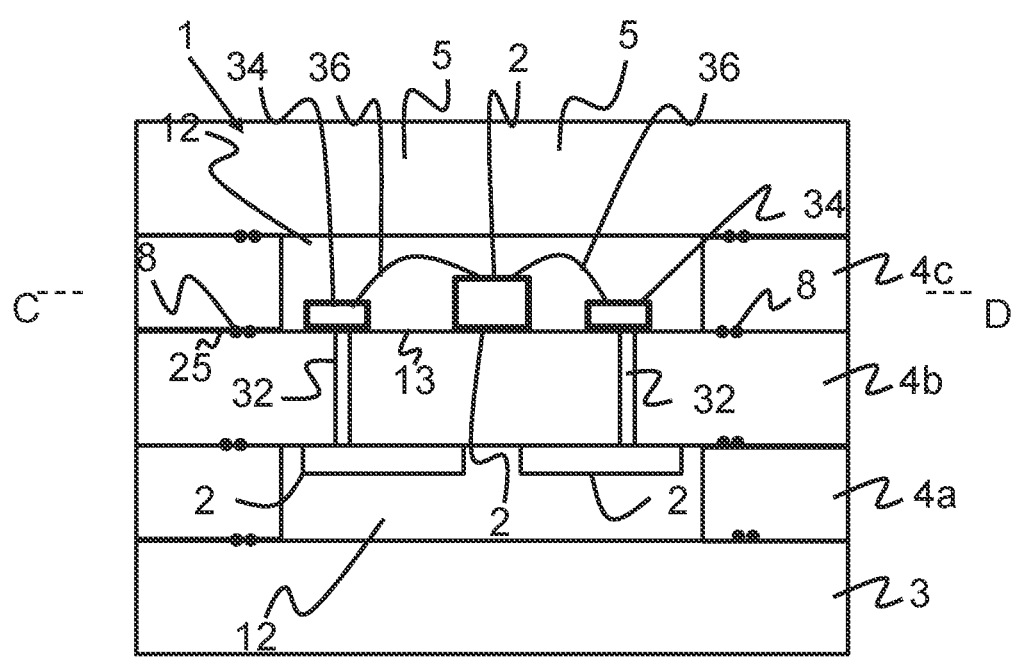
FIGS. 7 and 8 show further sectional side views through the functional area of two packages.

FIG. 7 shows an embodiment of the package 1 comprising a first intermediate glass layer 4a placed on base substrate 3, a component carrier layer 4b on which the components 2 are placed, a further intermediate glass layer 4c, and a cover substrate 5. In this embodiment, the functional areas 12, 13, 13a are provided such that they are located below and above the component carrier layer 4b. Welding lines 8 are provided all around the cavities 12 such that the cavities 12 are hermetically sealed on all sides thereof. The package 1 may be round or square and may, in principle, have any free shape.

The accommodation items 2, for example a sensor or actuator, are arranged on the lower side and the upper side of component carrier layer 4b, for example glued or welded thereto. Metallic pads 34 for making electrical contact with the accommodation item 2 are provided on either side of the accommodation item. The accommodation item 2 is electrically connected to further components 2 by contacting wires 32 such as bonding wires, for example. The metallic pads 34 may be metallic contact areas. The substrates are joined directly to one another by laser bonding lines 8. In the present case, two closed circumferential laser welding zones 8 were formed by directing the laser 9 twice around the cavity along contact area 25, i.e. along the outer edges of the cavities 12, but not on an exactly identical path. Rather, with each revolution around the cavity 12, the laser 9 was directed along a laterally offset path so that two laser welding zones 8 are created next to one another. For example, the micro-welding zones 8 in the present example have dimensions of 5 µm×10 µm or 10 µm×50 µm.

Figure 8:
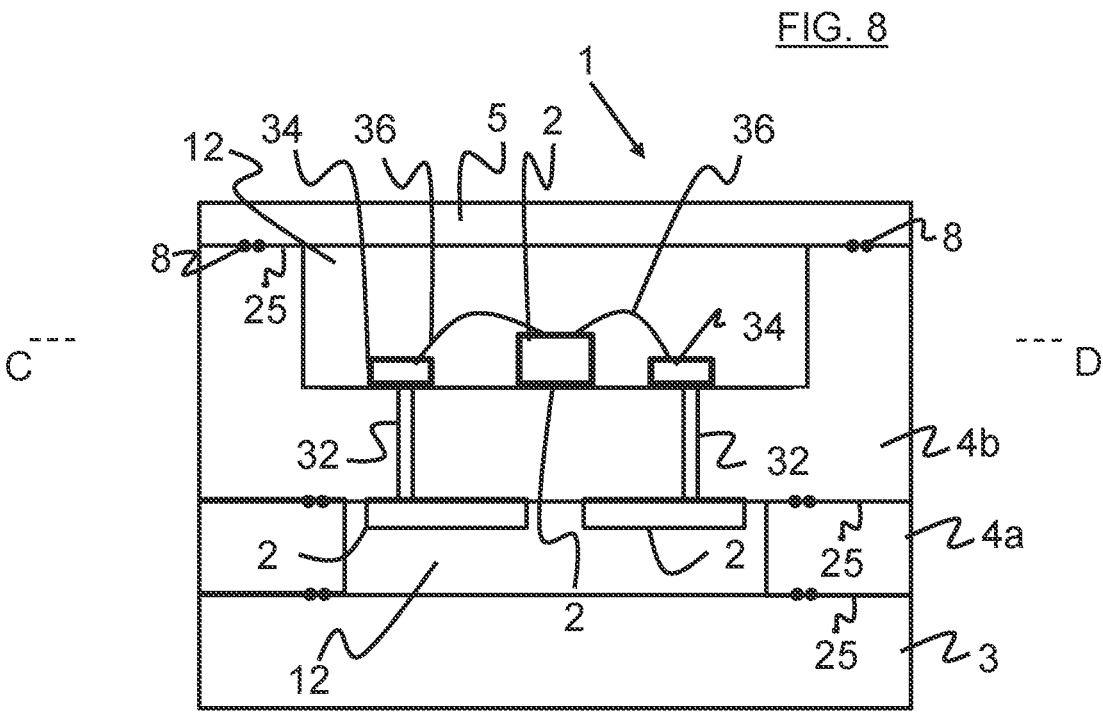

FIG. 8 shows an embodiment of the package 1 in which a cavity 12 has been introduced in the intermediate substrate or component carrier layer 4b. The cavity 12 can be introduced into the intermediate substrate 4b by a sandblasting process, for example, i.e. it may be recessed in the intermediate substrate 4b, more generally by using an abrasive process. Chemical etching is another option for introducing the cavity 12 into the intermediate substrate 4b. A possible advantage of this embodiment is that the cover substrate 5 can be made in the form of a simple glass sheet, for example, which is joined to the component carrier layer 4b by micro-welding and laser bonding lines 8. A possible advantage of this embodiment is that the components disposed in the upper cavity 12, that is the cavity that is recessed in the intermediate substrate 4b, are disposed so as to be protected by the intermediate substrate 4b already during the fabrication process. Moreover, one substrate layer is eliminated. In all embodiments in the figures, the same reference numerals denote the same features.

Figure 9:
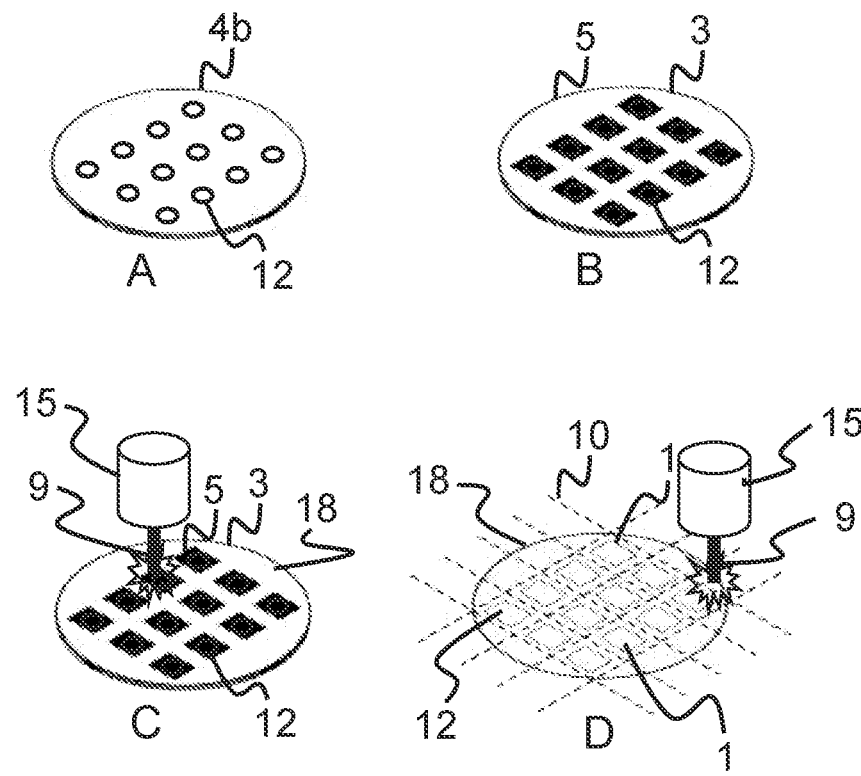
FIG. 9 shows exemplary further steps for producing a package.

Referring to FIG. 9 which shows another embodiment of the method for producing a multitude of packages 1. What shall be explained here is the production of packages as illustrated in FIG. 8, for example. It will be obvious for a person skilled in the art that it is likewise possible to produce just one single package 1, depending on process requirements.

In a step A, a shared component carrier substrate 4b is provided, which has a plurality of recesses 12 corresponding to the later cavities 12, and which were introduced into the component carrier substrate 4b by an abrasive method, for example. Respective accommodation items 2 are placed in each of the recesses 12, for example soldered to contacts 34 provided there or already mounted there (see FIGS. 6A-6E). In a step B, a shared cover substrate 5 is mounted on the component carrier substrate 4b, i.e. a separate cavity 12 is produced for each recess. It is possible to accommodate a plurality of accommodation items 2 in a shared cavity 12.

Subsequently, the mounting of further components 2 and the creation of further cavities 12 on the underside of the component carrier substrate 4b can be intended, see FIGS. 6C to 6E, and 8. For this purpose, a further intermediate glass layer 4a would be arranged on the lower side of the component carrier substrate 4b, and a base substrate 3 therebelow. This is optional in terms of the present manufacturing process.

In step C, the finished substrate stack is bonded together using a laser, so that the respective accommodation cavities 12 are hermetically sealed, which means the sealing of the cavities 12 all around along contact areas 25 and the introduction of the at least one laser bonding line 8 per package 1. For this purpose, a laser unit 15 is directed over the surface of the cover substrate 5 from above the cover substrate 5, and a focused laser beam 9 is selectively directed to the zones to be joined, that is to the contact areas 25. Once step C of the manufacturing process has been completed, all of the cavities 12 will have been hermetically sealed. Following step C, the individual packages 1 can be separated from one another by a cutting process, so as to obtain individual separate packages 1.

In step D, the components are separated from one another along separation or cutting lines 10. Optionally, the same laser as for the laser welding in step C may be used for this purpose. However, a conventional cutting technique may also be employed, if this is advantageous.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE NUMERALS

1 Hermetically sealed package
2 Accommodation item, functional component
3 Lower substrate, layer or wafer, base substrate, or lower cover
4, 4a, 4b, 4c Intermediate layer
4d, 4e, 4f Intermediate layer
5 Upper substrate, layer or wafer, cover substrate, or upper cover
8 Laser welding zone
9 Focused laser beam
10 Separation or cutting line
12 Accommodation cavity
13 Functional area
13a Second functional area
14 Edge
15 Laser unit for welding and/or cutting
16 Laser pulse impact area
18 Substrate stack
21 Edge of cavity
22 Bottom of cavity
23 Upper side of cavity
25 Contact area
32 Through-glass passage, through glass via
34 Electrical contact layer

What is claimed is:

1. A hermetically sealed package for thermal encapsulation of a functional area, comprising:
a base substrate;
a cover substrate, the base substrate together with the cover substrate forming at least part of the package or forming the package, at least one of the base substrate or the cover substrate being in the form of a thermal insulator;
at least one intermediate substrate disposed between the base substrate and the cover substrate;
at least one functional area hermetically sealed by the package, wherein heat can be generated inside the at least one functional area of the package;
at least one laser bonding line hermetically joining the base substrate and the at least one intermediate substrate and at least one laser bonding line hermetically joining the at least one intermediate substrate to the cover substrate, wherein each of the at least one laser bonding lines have a height (HL) perpendicular to the respective bonding plane;
wherein at least the at least one intermediate substrate comprises a vitreous material,
wherein the package comprises a plurality of cavities,
wherein a plurality of accommodation items is disposed in the package, and wherein the accommodation items are distributed to different cavities, at least one of the accommodation items being a heat generating component; and
the at least one intermediate substrate comprises through glass vias for electrically connecting the accommodation items disposed in different cavities, the at least one intermediate substrate having a first surface and a second surface opposite the first surface, the through glass vias being formed through the first surface and the second surface and the first surface and the second surface both being entirely encapsulated within the package.

2. The hermetically sealed package of claim 1, wherein at least one of the following is satisfied:
at least one of the base substrate, the at least one intermediate substrate, or the cover substrate is made of a material of low thermal conductivity; or
the base substrate, the at least one intermediate substrate, and the cover substrate are in the form of a thermal insulator.

3. The hermetically sealed package of claim 1, further comprising at least one electrical connection layer on the at least one intermediate substrate.

4. The hermetically sealed package of claim 1, wherein at least one of the base substrate, the at least one intermediate substrate, or the cover substrate is provided in the form of a multilayer composite.

5. The hermetically sealed package of claim 1, wherein the at least one laser bonding line having the height HL extends into material of the at least one intermediate substrate and the cover substrate provided above the at least one laser bonding line, and wherein the base substrate, the at least one intermediate substrate, and the cover substrate are joined together by being fused to one another.

6. The hermetically sealed package of claim 1, wherein a marker is incorporated in at least one of the base substrate, the at least one intermediate substrate, or the cover substrate.

7. The hermetically sealed package of claim 1, wherein the at least one laser bonding line circumferentially surrounds the at least one functional area at a distance (DF) therefrom.

8. The hermetically sealed package of claim 1, wherein at least one of the following is satisfied:
the at least one accommodation item comprises at least one of a power semiconductor chip, a GaN light emitting diode, a SiC power transistor, a GaAs power transistor, or a GaN power transistor; or
the at least one accommodation item forms part of the package.

9. The hermetically sealed package of claim 1, wherein the at least one functional area of the package is adapted for accommodating at least one accommodation item having a size of 10 mm×10 mm or less.

10. The hermetically sealed package of claim 1, further comprising at least one cavity and an insulating medium included in the at least one cavity to improve the insulating effect.

11. The hermetically sealed package of claim 1, wherein the package is transparent for a range of wavelengths at least one of at least partially or in sections thereof.

12. The hermetically sealed package of claim 1, wherein the at least one intermediate substrate is directly joined to the base substrate and/or the cover substrate.

13. The hermetically sealed package of claim 12, wherein the base substrate and the cover substrate are made from a vitreous material.

14. A method for providing a hermetically sealed package according to claim 1, the package enclosing a functional area in the form of multiple cavities, the method comprising:

providing a base substrate, at least one intermediate substrate, and a cover substrate, the cover substrate being transparent for at least one range of wavelengths at least partially or in sections thereof and therefore being a transparent cover substrate;

arranging multiple accommodation items inside the functional area, wherein the accommodation items are distributed to different cavities, at least one of the accommodation items being a heat generating component;

arranging the cover substrate on the base substrate above the at least one accommodation item thereby creating at least one contact area between the base substrate and the cover substrate, so that each package has at least one contact area; and hermetically sealing the functional area by forming at least one laser bonding line along the at least one contact area of each package;

wherein at least one of the base substrate or the cover substrate is designed to be thermally insulating;

wherein at least the at least one intermediate substrate comprises a vitreous material, and the at least one intermediate substrate comprises through glass vias for electrically connecting the accommodation items disposed in different cavities, the at least one intermediate substrate having a first surface and a second surface opposite the first surface, the through glass vias being formed through the first surface and the second surface and the first surface and the second surface both being entirely encapsulated within the package.

15. The method of claim 14, wherein a laser beam is directed around the functional area to form the laser bonding line so that the functional area is hermetically sealed circumferentially along the at least one contact area.

* * * * *